United States Patent [19]

Nolte

[11] Patent Number: 4,634,987

[45] Date of Patent: Jan. 6, 1987

[54] FREQUENCY MULTIPLIER

[75] Inventor: David B. Nolte, Prescott, Ariz.

[73] Assignee: Sundstrand Data Control, Inc., Redmond, Wash.

[21] Appl. No.: 656,257

[22] Filed: Oct. 1, 1984

[51] Int. Cl.⁴ .................... G06G 7/16; H03K 3/017
[52] U.S. Cl. .................................. 328/160; 328/15;
328/20; 328/156; 307/529; 307/271; 307/266; 307/498
[58] Field of Search ............... 307/529, 479, 525, 271, 307/266, 498; 328/15, 160, 133, 156, 20; 377/47

[56] References Cited

U.S. PATENT DOCUMENTS

| | | | |
|---|---|---|---|
| 3,448,387 | 6/1969 | Brandt et al. | 328/20 |
| 3,588,548 | 6/1971 | Williams | 307/295 |
| 3,745,470 | 7/1973 | Grob | 328/38 |
| 3,764,927 | 10/1973 | Allinger et al. | 329/104 |
| 3,770,327 | 11/1973 | Ruof | 303/21 R |
| 3,786,357 | 1/1974 | Belle Isle | 328/38 |
| 3,796,960 | 3/1974 | Frizzell et al. | 328/20 |
| 3,838,344 | 9/1974 | Tanimoto | 328/20 |
| 3,866,129 | 2/1975 | Cornelissen | 328/133 |
| 4,042,834 | 8/1977 | Pace | 307/224 R |
| 4,048,571 | 9/1977 | Jacobson | 328/20 |
| 4,051,386 | 9/1977 | Long et al. | 307/271 |
| 4,052,626 | 10/1977 | Tuma et al. | 307/271 |
| 4,077,010 | 2/1978 | Ryon | 328/20 |
| 4,540,945 | 9/1985 | Kuroki | 328/134 |

OTHER PUBLICATIONS

"Digital Multiplier", by Lawrence N. Merson, RCA Technical Notes, No. 736, Jan. 1968.

Primary Examiner—Stanley D. Miller
Assistant Examiner—Richard Roseen
Attorney, Agent, or Firm—Christensen, O'Connor, Johnson & Kindness

[57] ABSTRACT

VLF communication signals encoded in MSK format contain phase ambiguities that must be resolved in order to use such signals in navigation systems. The ambiguities are resolved by the present frequency multiplying device that in one embodiment operates to double the frequency of an input signal and mix the doubled input signal with a mixing signal to produce an output signal having first and second states. The device includes a transition detector (42) for generating a trigger signal in response to each low-to-high or high-to-low transition of the input signal that occurs when the output signal is in its second state, and a bistable circuit (44) for generating the output signal in response to the trigger signal and to a mixing signal. The bistable circuit responds to the trigger signal to cause the output signal to be in its first state, and responds to a periodic characteristic of the mixing signal to cause the output signal to be in its second state. The transition detector may comprise a positive edge triggered flip-flop (50) and a negative edge triggered flip-flop (52). The bistable means may comprise a third flip-flop (56) having the mixing signal connected to its clock input and the trigger signal connected to its clear input. The frequency doubling device may also include means (58) for selectively disabling the second flip-flop so that the frequency of the input signal is not doubled.

14 Claims, 10 Drawing Figures

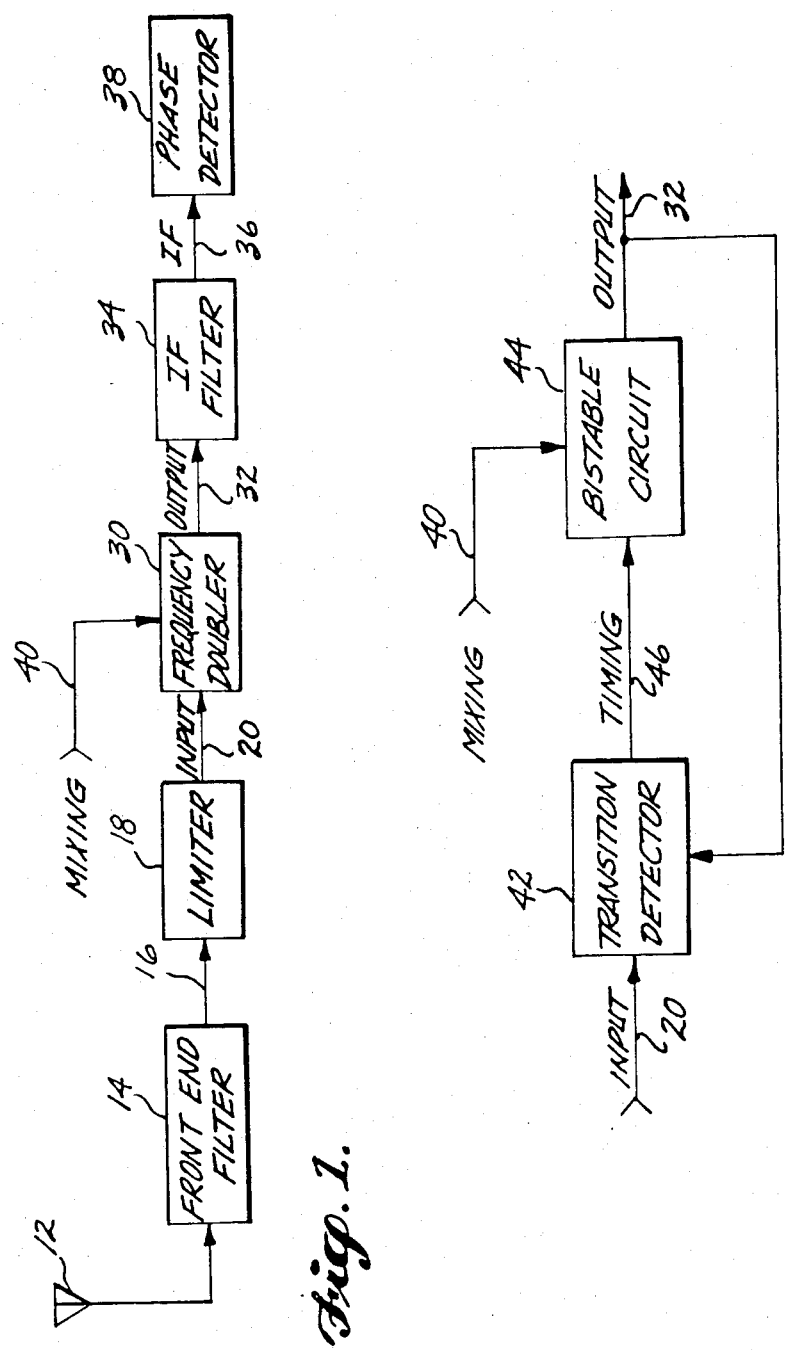

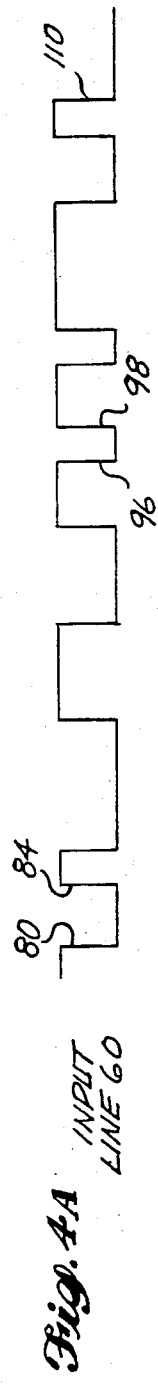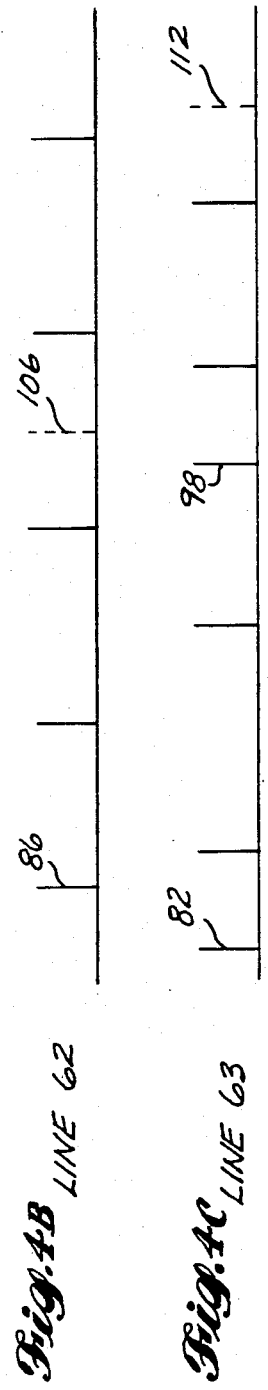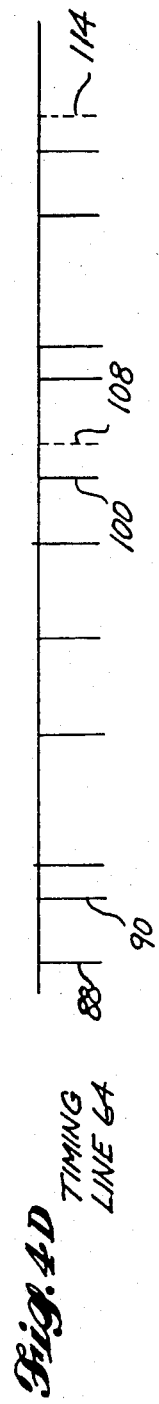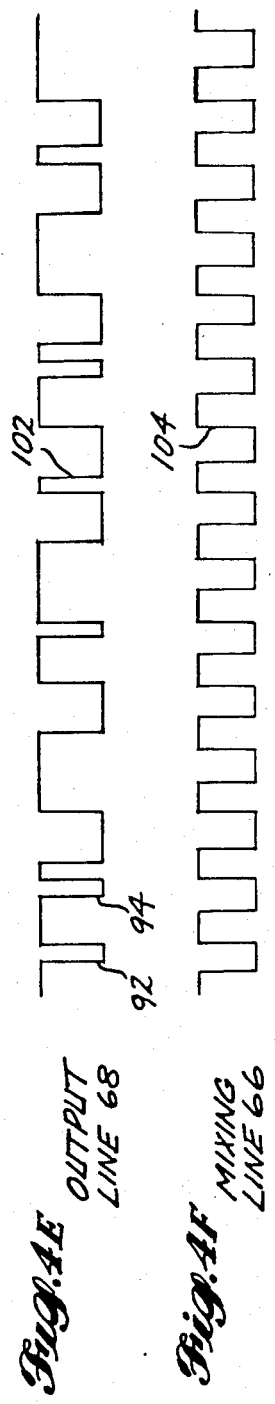
Fig. 4A INPUT LINE 60
Fig. 4B LINE 62
Fig. 4C LINE 63
Fig. 4D TIMING LINE 64
Fig. 4E OUTPUT LINE 68
Fig. 4F MIXING LINE 66

FREQUENCY MULTIPLIER

FIELD OF THE INVENTION

The present invention relates to devices for multiplying the frequency of an input signal and for multiplying the frequency of an input signal and mixing the multiplied input signal with a mixing signal.

BACKGROUND OF THE INVENTION

VLF (very low frequency) communication stations are often used by long-range automated navigation systems as a source of high stability, long-wave, worldwide reference signals. Such navigation systems make use of the phase, but not the data content, of the VLF signals. In the past, VLF stations have used the FSK (frequency shift keying) format to encode data. Recently, however, such stations have begun to alter their transmissions to the more efficient MSK (minimum shift keying) format. The use of the MSK format results in data dependent 180° phase reversals of the transmitted signal. Such phase reversals introduce ambiguities in the phase measurements necessary to relate the VLF signals to geographic position. Therefore as VLF stations were converted to the MSK format, they were lost for use as navigation signal sources. A method of resolving the phase ambiguity caused by the data dependent 180° phase reversals was required for continued use of the VLF stations as navigation aids.

It is known that the phase ambiguities inherent in the MSK format can be resolved by doubling the frequency of the received VLF signal. The phase measurement of this doubled frequency signal is then independent of the 180° phase reversals. The initial method of performing the doubling in VLF navigation receivers involved the use of an analog multiplying technique with some band limiting and wide dynamic range. Although this method was effective, it resulted in great loss of signal and in frequency instability due to the sensitive nature of the required components. There has therefore been a need to improve upon the analog multiplication technique to reduce these undesirable side effects.

SUMMARY OF THE INVENTION

The present invention provides a device for multiplying the frequency of an input signal and for multiplying an input signal and mixing the multiplied input signal with a mixing signal to produce an output signal. Although the device of the present invention is described herein in the context of a VLF navigation system, the invention is applicable to any system in which frequency multiplying or frequency multiplying with mixing is required. Because the present invention makes use of digital techniques, it does not suffer from the signal loss and frequency instability problems associated with prior analog approaches.

In one preferred embodiment, the present invention comprises a device that is adapted to produce an output signal having first and second states. The device comprises means for generating a trigger signal in response to each low-to-high or high-to-low transition of the input signal that occurs when the output signal is in its second state, and bistable means for generating the output signal in response to the trigger signal and to a mixing signal. The bistable means is responsive to the trigger signal to cause the output signal to be in its first state, and is responsive to a periodic characteristic of the mixing signal to cause the output signal to be in its second state. Therefore when an input signal transition occurs while the output signal is in its second state, the output signal enters its first state and remains in its first state until the next periodic characteristic of the mixing signal occurs. The means for generating a trigger signal may comprise a first flip-flop adapted to trigger upon the occurrence of a low-to-high transition of the input signal, and a second flip-flop adapted to trigger upon the occurrence of a high-to-low transition of the input signal. The bistable means may comprise a third flip-flop. In a preferred embodiment, the means for generating a trigger signal comprises only two flip-flops and a logic means, and the entire device comprises only three flip-flops and a logic means. The mixing signal is connected to the clock input of the third flip-flop, the output signal is taken from the output of the third flip-flop, and the trigger signal is connected to the clear input of the third flip-flop. The device of the present invention may also comprise means for selectively disabling the second flip-flop such that the frequency of the input signal is not doubled.

In another aspect, the present invention comprises edge triggering means for generating a timing signal having first and second states, and bistable means for generating an output signal having first and second states. The edge triggering means is responsive to each rising and falling edge of the input signal that occurs when the output signal is in its second state to cause the timing signal to be in its first state. The edge triggering means is also responsive to the output signal being in its first state to cause the timing signal to be in its second state. The bistable means is responsive to the timing signal being in its first state to cause the output signal to be in its first state, and is responsive to a periodic characteristic of the mixing signal to cause the output signal to be in its second state. Therefore when a rising or falling edge of the input signal occurs when the output signal is in its second state, the timing signal enters its first state, causing the output signal to enter its first state. The output signal entering its first state in turn results in the timing signal returning to its second state.

In a further aspect, the present invention comprises a circuit for multiplying the frequency of an input signal comprising first detection means for detecting a first transition of the input signal and generating a first detection signal, second detection means for detecting a second transition of the input signal and generating a second detection signal, and combining means for combining the first and second detection signals to generate an output signal having a frequency that is a multiple of the input signal frequency.

In a further aspect of the invention, the circuit utilizes switching elements for generating an output signal that has a multiple of the frequency of the input signal. The frequency of the input signal, including noise, can range from essentially DC to a frequency approaching the switching frequency of the switching element. The phase delay between the input signal and the output signal is substantially invariant with respect to temperature and with respect to the frequency of the input signal. The phase delay of the output signal from a first transition of the input signal is substantially the same as a phase delay from a second transition of the input signal.

BRIEF DESCRIPTION OF THE DRAWINGS

FIG. 1 is a block diagram of a portion of a VLF navigation receiver.

FIG. 2 is a block diagram of the frequency multiplying device of the present invention.

FIGS. 4A–4F comprise signal and timing diagram for the embodiment of FIG. 3.

DETAILED DESCRIPTION OF THE DRAWINGS

Figure 3:
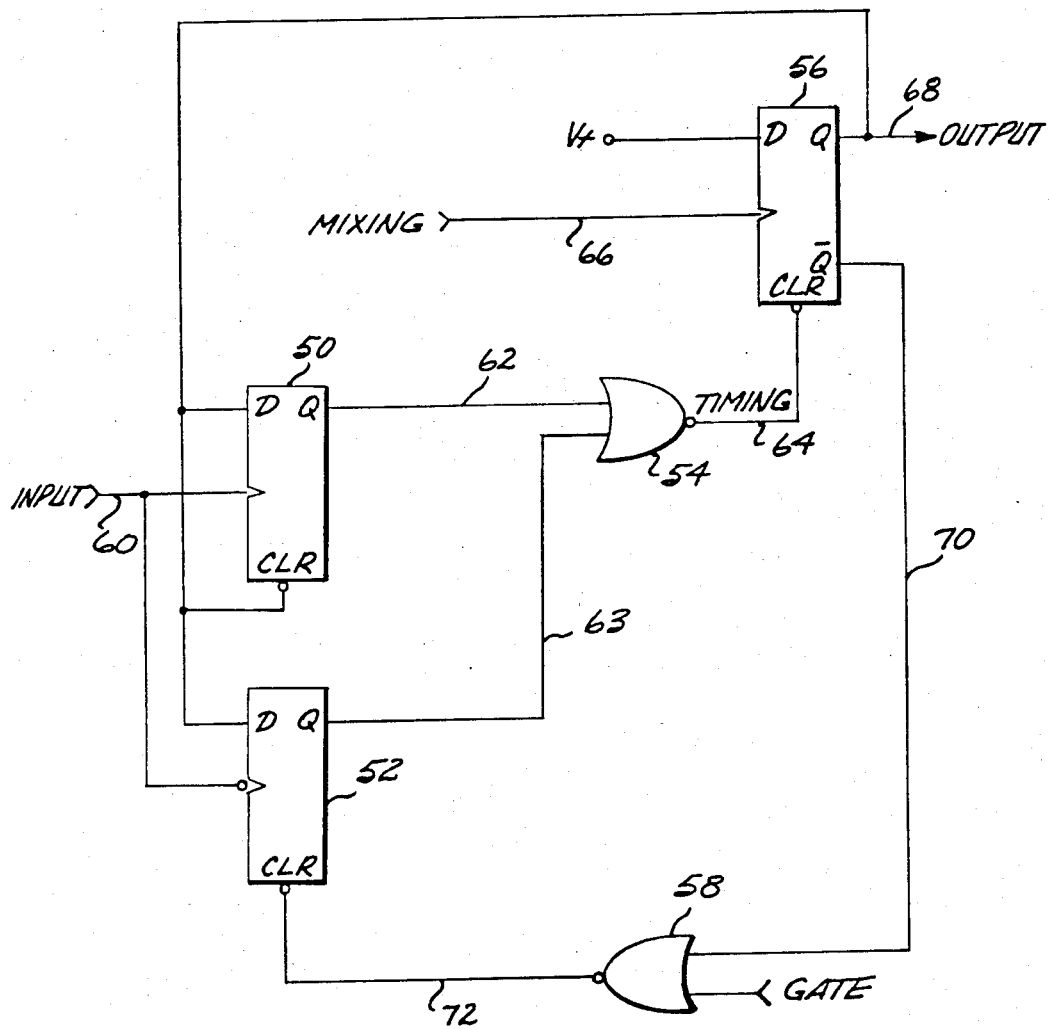
FIG. 3 is a circuit diagram of a preferred embodiment of the present invention.

FIG. 1 is a block diagram of a portion of a VLF navigation system that incorporates a frequency doubling device according to the present invention. The circuit of FIG. 1 is adapted for receiving and processing VLF signals encoded in the MSK format. In such a signal transmitted from a particular station, a VLF carrier is modulated by a 25 Hz signal to produce two sidebands, an upper sideband 25 Hz above the carrier and a lower sideband 25 Hz below the carrier. The VLF transmission consists exclusively of the upper and lower sidebands, the carrier being suppressed. Each sideband can be transmitted in either a direct form or in an inverted form 180° out of phase with the direct form. At any given time, the VLF transmission from the station consists of one of the two sidebands in one of the two forms. Switching between direct and inverted forms occurs at zero crossings of the transmitted signal.

Referring to FIG. 1, VLF signals are received by antenna 12 and input into front end filter 14. Front end filter 14 is a narrow band pass filter that selects a particular sideband of a particular carrier. The resulting single sideband signal 16 is transmitted to limiter 18. The limiter converts the sinusoidal single sideband signal into rectangular pulse input signal 20. Input signal 20 is one of the inputs to frequency doubler 30 of the present invention, the other input being mixing signal 40. Frequency doubler 30 produced output signal 32 that consists of a mixture of mixing signal 40 and doubled input signal 20. The output signal is input into narrow band IF filter 34. The IF filter selects a single frequency component of output signal 32, converts such component to sinusoidal IF signal 36, and sends the IF signal to phase detector 38.

The frequency of mixing signal 40 is selected based upon the pass band of IF filter 34. For example in one preferred embodiment, the pass band of IF filter 34 is 50 Hz, and in this embodiment the frequency $f_1$ of mixing signal 40 is preferably determined according to the equation:

$$f_1 = 2 \cdot f_2 + 50 \tag{1}$$

where $f_2$ is the frequency of input signal 20, i.e., the frequency of the sideband selected by front end filter 14. One of the components of output signal 32 will therefore be a "beat" component having a frequency of $f_1 - 2 \cdot f_2$, or 50 Hz, and this 50 Hz beat component will be selected by the IF filter.

FIG. 2 illustrates the operation of frequency doubler 30. The frequency doubler comprises transition detector 42 and bistable circuit 44. Transition detector 42 receives input signal 20 and output signal 32, and produces timing signal 46. Bistable circuit 44 receives timing signal 46 and mixing signal 40, and produces output signal 32 that has first and second (e.g., low and high) states. Timing signal 46 preferably comprises a series of trigger signals, a trigger signal being produced by transition detector 42 whenever a low-to-high transition (e.g., a rising edge) or high-to-low transition (e.g., a falling edge) of input signal 20 occurs when the output signal is in its second state. Bistable circuit 44 responds to each trigger signal by causing the output signal to be in its first state, and responds to a periodic characteristic of mixing signal 40 (e.g., a rising edge) to cause the output signal to be in its second state. As a result, a transition of input signal 20 that occurs when the output signal is in its second state results in transition detector 42 issuing a trigger signal that causes bistable circuit 44 to change the output signal to its first state. The output signal remains in its first state until the next rising edge (or other predefined characteristic) of mixing signal 40 occurs. While output signal 32 remains in its first state, transition detector 42 is unresponsive to transitions of input signal 20.

FIG. 3 sets forth a circuit diagram of one preferred embodiment of the present invention. In this embodiment, the transition detector comprises positive edge triggered flip-flop 50, negative edge triggered flip-flop 52, and NOR gate 54, and the bistable circuit comprises flip-flop 56. Any suitable, equivalent switching elements could be used in place of flip-flops 50 and 52. The embodiment of FIG. 3 also includes NOR gate 58, the purpose of NOR gate 58 being described below. The input signal is connected to the clock inputs of flip-flops 50 and 52 by line 60. The Q output of flip-flop 50 is connected to NOR gate 54 by line 62, and the Q output of flip-flop 52 is connected to other input of NOR gate 54 by line 63. The timing signal at the output of NOR gate 54 is connected by line 64 to the clear (CLR) input of flip-flop 56, the clear function being active low. The mixing signal is input to the clock input of flip-flop 56 by line 66. The data (D) input of flip-flop 56 is connected to a high voltage source. The Q output of flip-flop 56 is connected to line 68, the signal on line 68 comprising output signal 32. Line 68 is connected to the data (D) inputs of flip-flops 50 and 52, as well as the clear (CLR) input of flip-flop 50. The $\overline{Q}$ output of flip-flop 56 is connected by line 70 to one input of NOR gate 58, the other input to NOR gate 58 being the gate signal described below. The output of NOR gate 58 is connected by line 72 to the clear (CLR) input of flip-flop 52. The clear functions of flip-flops 50 and 52 are both active low. Because the Q and $\overline{Q}$ outputs of the flip-flop 56 are complementary, and because when the gate signal is low NOR gate 58 inverts the signal on line 70, the result is that flip-flops 50 and 52 are simultaneously cleared when a low signal appears on line 68.

The operation of the circuit of FIG. 3 can be understood by reference to the signal and timing diagram of FIG. 4. FIG. 4A represents one example of input signal 20 on line 60. In a VLF navigation receiver, the input signal would include all VLF signals in a selected sideband, plus all atmospheric noise within that sideband. The first high-to-low transition 80 of the input signal is detected by flip-flop 52 and results in a high signal 82 appearing on line 63 (FIG. 4C). The subsequent low-to-high transition 84 of the input signal results in a similar high signal 86 appearing on line 62 (FIG. 4B). A high signal appearing on either line 62 or line 63 results in the timing signal on line 64 going low (FIG. 4D). When line 64 goes low, flip-flop 56 is cleared, resulting in the output signal on line 68 going low (FIG. 4E). The output signal then remains low until the next rising edge of the mixing signal on line 66 (FIG. 4F). When such rising edge occurs, the output signal returns to its high state because the D input of flip-flop 56 is held at a high voltage. When the output signal goes low in response to the timing signal going low, flip-flops 50 and 52 are cleared, driving the signals on lines 62 and 63 low. The low signals on lines 62 and 63 result in the timing signal on line 64 going high. As a result of this feedback, the timing signal on line 64 is only momentarily driven low in response to the rising and falling edges of the input signal, and the timing signal therefore comprises a series of short duration, negative going trigger signals or trigger pulses. In FIG. 4, trigger signals 88 and 90 correspond to transitions 80 and 84 respectively of the input signal. Therefore except as described below, the frequency of the timing signal on line 64 is double that of the input signal. Trigger signals 88 and 90 result in negative going pulses 92 and 94 respectively in the output signal on line 68.

The mixing action of the circuit of FIG. 3 can be appreciated with reference to falling edge 96 and rising edge 98 of the input signal. Falling edge 96 produces a high signal 98 on line 63 and a resulting low timing or trigger signal 100 on line 64. Timing signal 100 produces high-to-low transition 102 in the output signal, and the output signal remains low until the next rising edge 104 of the mixing signal. However, during the time that the output signal remains low after transition 102, rising edge 98 of the input signal occurs. Because the output signal is low at this time, the high signal 106 that would otherwise occur on line 62 is blocked, and the low timing signal 108 is also blocked, such blocked pulses being indicated by dashed line in FIG. 4. As a result, rising edge 98 of the input signal is in effect ignored and not reproduced in the output signal. In a similar manner, falling edge 110 of the input signal is also not reproduced in the output signal, signals 112 and 114 representing the blocked portions of the signals on line 63 and on line 64 respectively.

The circuit of FIG. 3 is adapted to selectively operate in a mode in which the frequency of the input signal is not doubled. To produce undoubled operation, a high gate signal is provided to NOR gate 58. As a result, the output of the NOR gate on line 72 is held low, disabling flip-flop 52. As a result, only positive edges of the input signal produce a trigger signal on line 64.

Figure 5:
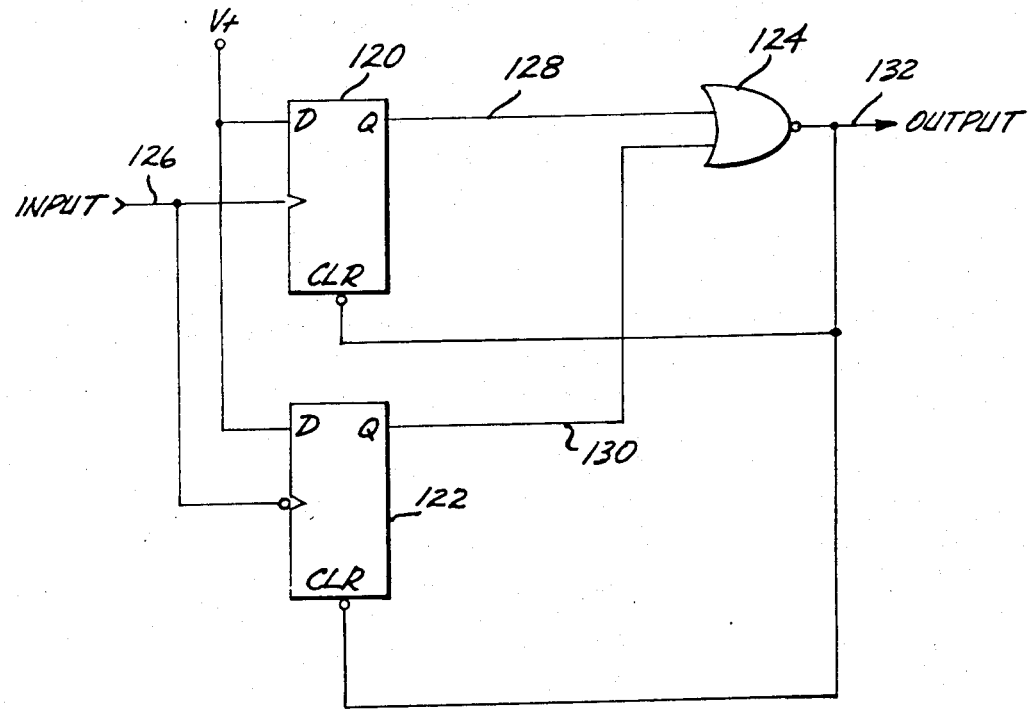
FIG. 5 is a circuit diagram of a second preferred embodiment of the present invention.

FIG. 5 sets forth an embodiment of the present invention that may be used when frequency doubling without mixing is required. The device of FIG. 5 comprises positive edge triggered flip-flop 120, negative edge triggered flip-flop 122, and NOR gate 124. An input signal on line 126 is connected to the clock inputs of flip-flops 120 and 122. The data (D) inputs of flip-flops 120 and 122 are connected to a source of high voltage. The Q outputs of flip-flops 120 and 122 are connected by lines 128 and 130, respectively, to the inputs of NOR gate 124. The output signal produced by the NOR gate on line 132 is coupled back to the clear inputs of flip-flops 120 and 122. The clear functions of these flip-flops are active low.

The operation of the device of FIG. 5 is very similar to the operation of the corresponding portion of the FIG. 3 device. A rising edge of the input signal causes the signal on line 128 to go high, causing the output signal on line 132 to go low. Similarly, a falling edge of the input signal results in a high signal on line 130, also driving the output signal low. Whenever the output signal goes low, both flip-flops are cleared, and as a result the output signal immediately goes high again. The output signal on line 132 therefore will consist of a series of narrow pulses or spikes corresponding to each edge or transition of the input signal.

The frequency doubling devices of FIGS. 3 and 5 possess a number of significant advantages over prior frequency doubling circuits. Referring to FIG. 5, flip-flops 120 and 122 will be characterized by a switching time that is defined as the time required for the flip-flop to switch states in response to a transition of the input signal. Such switching times are typically very short. Because each flip-flop is cleared almost immediately after it switches state, the circuit of FIG. 5 may be utilized to double the frequency of input signals over a wide frequency range. In particular, the frequency of the input signal, including any noise, may range from essentially DC (i.e., zero frequency) to a frequency approaching the maximum switching rate of flip-flops 120 and 122. For a similar reason, the phase delay through the frequency doubling devices of FIGS. 3 and 5 is very small. Therefore, when such devices are used in a system in which it is important to preserve the phase of the input signal, such as the VLF navigation system shown in FIG. 1, the frequency doubling operation produces negligible phase errors. The circuit of FIGS. 3 and 5 further have the advantage that the small phase delay they do cause are independent of both temperature and of the frequency of the input signal. In addition, the phase delay produced by these devices is the same for both rising and falling edges of the input signal, therefore introducing symmetrical phase delays into the output signal.

While the preferred embodiments of the invention have been illustrated and described, it should be understood that variations will be apparent to those skilled in the art. Accordingly, the invention is not to be limited to the specific embodiments illustrated and described, and the true scope and spirit of the invention are to be determined by reference to the following claims.

The embodiments of the invention in which an exclusive property or privilege is claimed are defined as follows:

1. A device for receiving an input signal having a frequency, for doubling the frequency of the input signal to produce a doubled input signal, and for mixing the doubled signal with a mixing signal to produce an output signal having first and second states, the device comprising means for generating a trigger signal in response to each low-to-high transition and each high-to-low transition of the input signal that occurs when the output signal is in its second state, and bistable means for generating the output signal, the bistable means being responsive to the trigger signal to cause the output signal to be in its first state and responsive to a periodic characteristic of the mixing signal to cause the output signal to be in its second state, whereby a transition of the input signal that occurs when the output signal is in its second state results in the output signal entering its first state and remaining in its first state until the next periodic characteristic of the mixing signal occurs.

2. The device of claim 1, wherein the means for generating a trigger signal comprises a first flip-flop connected to receive the input signal and adapted to produce a first output signal on a first output terminal that changes levels upon the occurrence of a low-to-high transition of the input signal, a second flip-flop connected to receive the input signal and adapted to produce a second output signal, on a second output terminal that changes levels upon the occurrence of a high-to-low transition of the input signal, and gate means for receiving the first and second output signals and producing the trigger signal therefrom.

3. The device of claim 2, wherein the gate means comprises a NOR gate having first and second input terminals and an output terminal, the first and second output terminals being connected to the first and second input terminals respectively of the NOR gate, the trigger signal being produced at the output terminal of the NOR gate.

4. The device of claim 3, wherein the bistable means comprises a third flip-flop having a clock input terminal and an output terminal, the mixing signal being connected to the clock input terminal of the third flip-flop and the output signal being taken from the output terminal of the third flip-flop.

5. The device of claim 4, wherein the third flip-flop includes a clear input terminal, and wherein the trigger signal is connected to the clear input terminal of the third flip-flop.

6. The device of claim 2, further comprising means connected to the second flip-flop for selectively disabling the second flip-flop such that the frequency of the input signal is not doubled.

7. A device for receiving an input signal having a frequency, for doubling the frequency of the input signal to produce a doubled input signal, and for mixing the doubled input signal with a mixing signal to produce an output signal having first and second state, the device comprising:
   edge-triggering means for generating a timing signal having first and second states, the edge-triggering means being responsive to each rising edge and each falling edge of the input signal that occurs when the output signal is in its second state to cause the timing signal to be in its first state, and being responsive to the output signal being in its first state to cause the timing signal to be in its second state; and
   bistable means responsive to the timing signal being in its first state to cause the output signal to be in its first state and responsive to a periodic characteristic of the mixing signal to cause the output signal to be in its second state, whereby a rising or falling edge of the input signal that occurs when the output signal is in its second state causes the timing signal to enter its first state, the timing signal entering its first state causing the output signal to enter its first state, the output signal entering its first state in turn resulting in the timing signal returning to its second state.

8. The device of claim 7, wherein the edge-triggering means comprises a first flip-flop connected to receive the input signal and adapted to produce a first output signal on a first output terminal that changes levels upon the occurrence of a rising edge of the input signal, a second flip-flop connected to receive the input signal and adapted to produce a second output signal on a second output terminal that changes levels upon the occurrence of a falling edge of the input signal, and gate means for receiving the first and second output signals and producing the trigger signal therefrom.

9. The device of claim 8, wherein the gate means comprises a NOR gate having first and second input terminals and an output terminal, the first and second output terminals being connected to the first and second input terminals respectively of the NOR gate, the timing signal being produced at the output terminal of the NOR gate.

10. The device of claim 9, wherein the bistable means comprises a third flip-flop having a clock input terminal and an output terminal, the mixing signal being connected to the clock input terminal of the third flip-flop and the output signal being taken from the output terminal of the third flip-flop.

11. The device of claim 10, wherein the third flip-flop includes a clear input terminal, and wherein the timing signal is connected to the clear input terminal of the third flip-flop.

12. The device of claim 8, further comprising means connected to the second flip-flop for selectively disabling the second flip-flop such that the frequency of the input signal is not doubled.

13. A circuit for multiplying the frequency of an input signal by two, comprising:
   first detection means for detecting a first transition of the input signal and generating a first detection signal;
   second detection means for detecting a different second transition of the input signal and generating a second detection signal; and
   logic means for combining said first and second detection signals to generate an output signal having a frequency that is twice the input signal frequency, the logic means including feedback means for feeding back said output signal to said first and second detection means.

14. The circuit of claim 13, additionally including a source of a mixing signal and wherein said feedback means includes means for combining said mixing signal with said first and second detection signals such that said mixing signal is mixed into said output signal.

* * * * *